United States Patent [19]

Katano et al.

[11] 4,405,709

[45] Sep. 20, 1983

[54] PROCESS FOR FABRICATING GRAVURE PRINTING PLATE BLANK

[75] Inventors: Seiji Katano, Oiso; Masataka Atsumi, Tokyo, both of Japan

[73] Assignee: Dai Nippon Insatsu Kabushiki Kaisha, Japan

[21] Appl. No.: 249,403

[22] Filed: Mar. 31, 1981

Related U.S. Application Data

[62] Division of Ser. No. 35,072, May 1, 1979, abandoned.

[30] Foreign Application Priority Data

May 4, 1978 [JP] Japan ................................. 53-53450

[51] Int. Cl.³ .......................... C23F 1/02; C03C 15/00; C03C 25/06; B41C 1/00
[52] U.S. Cl. .................................. 430/307; 101/463.1; 101/401.1; 156/645; 156/656; 156/659.1; 156/661.1; 156/905; 204/6; 204/17; 430/310
[58] Field of Search ...................... 204/17, 6; 430/300, 430/302, 306, 307, 309, 310; 101/401.1, 130, 150, 170, 395, 463.1; 156/655, 656, 659.1, 658, 660, 661.1, 905

[56] References Cited

U.S. PATENT DOCUMENTS 1,665,000  4/1928  Trist .................................. 204/17 X
2,107,294  2/1938  Griswold ...................... 101/401.1 X
2,373,087  4/1945  Alger ................................. 101/401.1

*Primary Examiner*—William A. Powell
*Attorney, Agent, or Firm*—Parkhurst & Oliff

[57] ABSTRACT

A reusable gravure printing plate or cylinder blank which can be readily processed into a printing plate or cylinder carrying an image to be printed. The blank comprises a non-etchable, wear-resistant layer, as of chromium, overlying at least the surface of a base, and a multiplicity of minute dot-like etchable portions, as of copper, which are of equal size and uniform placement, and which are formed at least in and isolated from each other by the non-etchable layer. The etchable portions are formed flush with the non-etchable layer. For preparation of a gravure printing plate or cylinder from this blank an etching operation is performed on the blank through a prepared etching resist, as with the use of a ferric chloride solution. The etchant forms ink-retaining cells in the etchable portions of the blank.

7 Claims, 45 Drawing Figures

FIG. 25
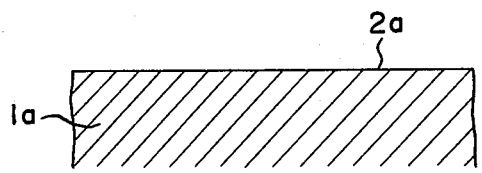
FIG. 26
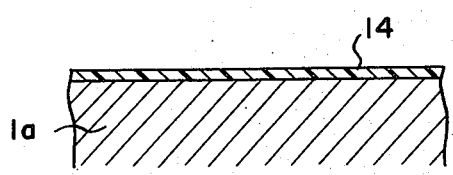
FIG. 27
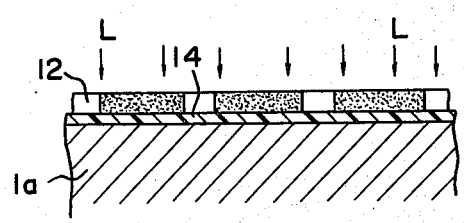
FIG. 28
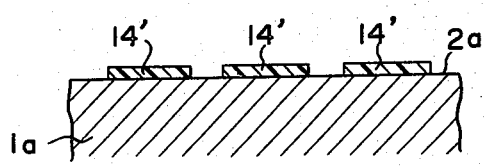
FIG. 29A
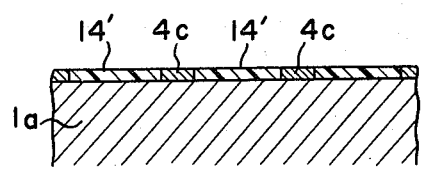
FIG. 29B
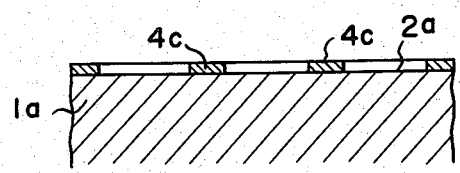
FIG. 30A
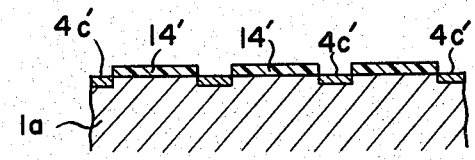
FIG. 30B
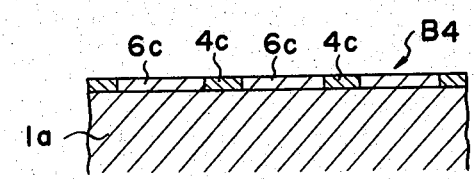
FIG. 31

PROCESS FOR FABRICATING GRAVURE PRINTING PLATE BLANK

This is a division of application Ser. No. 35,072 filed May 1, 1979, now abandoned.

BACKGROUND OF THE INVENTION

This invention relates to the art of platemaking, and in particular to a gravure printing plate blank, or half-finished gravure printing plate, which can be readily and repeatedly processed into a completed printing plate. The invention also particularly concerns a process for the fabrication of the gravure printing plate blank. The terms "printing plate" and "printing plate blank", as used herein and in the claims appended hereto, should be interpreted in a broad sense, as they are intended to connote those in the form of a solid cylinder; indeed, in some instances, these terms will be used synonymously with "printing cylinder" and "printing cylinder blank" respectively.

There exist many and varied types of gravure printing plates in current usage. Among these are "conventional gravure" printing plates, intaglio halftone gravure printing plates, those formed by electronic and other engraving processes, and those utilizing plastics. The first recited conventional gravure makes up the mainstream of gravure platemaking.

The preparation of a printing plate or cylinder by the conventional gravure method starts with the copper-plating of an iron or steel cylinder. Silver and copper are then plated successively over the copper-plated cylinder. The silver plating serves as a stripping layer, and the outer copper plating forms the so-called Ballard layer. A subsequent grinding of the Ballard layer provides a smooth-surfaced printing plate blank.

For processing this blank into a printing plate, ready for printing operation, a sensitized carbon tissue is exposed through a gravure screen and a continuous-tone positive. The exposed carbon tissue is then placed over the above prepared blank and is developed to provide an etching resist. An etching operation is then performed on the blank through the resist, thereby forming ink-retaining cells or depressions of equal surface area but of unequal depth. After removal of the resist the printing plate is usually chromium-plated for longer printing life.

Upon completion of required runs of printing operation the Ballard layer is stripped from the cylinder together with the silver stripping layer. The cylinder subsequently undergoes the steps of silver and copper plating and so returns to the blank state. The process set forth in the preceding paragraph is then repeated for delineation of a new printing image on the blank. Thus the operations of gravure platemaking and remaking according to the prior art involve unnecessary complex, time-consuming and costly processes, necessitating wasteful use of copper.

SUMMARY OF THE INVENTION

It is an object of this invention to materially simplify the processes of gravure platemaking and remaking by the provision of a reusable gravure printing plate blank of entirely novel concept which can be readily processed into a printing plate carrying an image to be printed.

Another object of the invention is to realize economy in the use of copper or like material employed for gravure platemaking and remaking, by the provision of the reusable gravure printing plate blank.

A further object of the invention is to provide a gravure printing plate prepared from the blank of the above defined character, which plate has ink-retaining cells formed to varying depths and/or in varying areas.

It is also an object of this invention to provide a process for the efficient fabrication of the gravure printing plate blank of the foregoing character and further a process for the preparation of a gravure printing plate by use of the blank.

In summary, the gravure printing plate blank according to this invention comprises a non-etchable layer overlying at least the surface of a base and made of a material resistive to a prescribed etchant, and a multiplicity of minute dot-like etchable portions of equal size and uniform placement formed at least in and isolated from each other by the non-etchable layer. The etchable portions are made of a material that can be corroded by the prescribed etchant and are disposed flush with the non-etchable layer.

The term "prescribed etchant" used in the above summary stands for the particular etching solution intended for use in processing the blank into a gravure printing plate. Preferably the non-etchable layer is of chromium, and the etchable portions are of copper.

For preparation of a gravure printing plate from the blank, in a typical example, a carbon tissue is exposed through a continuous-tone positive, transferred on to the blank, and developed to provide an etching resist. Through this etching resist the blank is then etched with the noted etchant, which usually is a ferric chloride solution. The etching operation produces the desired ink-retaining cells of varying depths in the etchable portions of the blank, thereby completing the gravure printing plate.

This platemaking process according to the invention presents a striking contrast to the "conventional gravure" process which requires the printing of both gravure screen and continuous-tone positive on a carbon tissue or the like. Eliminating the need for printing a gravure screen on a carbon tissue, the inventive process succeeds in simplification of the gravure platemaking operation.

One of the features of the gravure printing plate blank according to the invention resides in the non-etchable layer of chromium or like wear-resistant material. The completed printing plate, the non-etchable layer overlies the "lands" between the ink-retaining cells and serves to receive the brunt of the wear, thereby protecting the cells. Thus the blank according to the invention also eliminates the need for the chromium-plating of the completed printing plate and so, in this respect too, simplifies the platemaking operation.

The gravure printing plate blank according to the invention is also notable for the ease with which it permits renewal or alteration of printing images. According to one of the possible methods of image renewal, the used printing plate is first washed and made free of the printing ink. The ink-retaining cells are then refilled by the plating of copper or like etchable material. Upon subsequent grinding of the plate the same regains the blank state, to be processed through the above described procedure to carry a new image to be printed. This process of image renewal is much simpler than that according to the prior art, which requires the removal of the used Ballard layer and the formation of a new stripping layer by silver plating and of a new Ballard layer by copper plating.

The gravure printing plate blank according to the invention further possesses the advantage of affording a great saving on copper or like etchable material required for each image renewal operation. Heretofore copper has had to be plated to a thickness of 100 to 200 microns to form the Ballard layer at the time of initial platemaking and for each of the succeeding image renewal operations. Contrastively, according to this invention, each image renewal operation requires an amount of copper approximately equal to the sum of the capacities of all the ink-retaining cells that have been formed in the plate. The depth of these cells is of course less than the thickness of the conventional Ballard layer. A tremendous curtailment is thus realized in the amounts of copper or like etchable material used for gravure platemaking and remaking.

In some preferred forms of the gravure printing plate blank according to the invention, the etchable portions are received in respective pockets or depressions formed in the base. The non-etchable layer further covers the surface portions of the base bounding the pockets and thus serves to prevent the formation of the ink-retaining cells to any unnecessarily great depth. The cells will therefore carry only proper amounts of ink and will be refilled with a minimum amount of the etchable material.

The process for the fabrication of the gravure printing plate blank according to the invention comprises the steps of forming at least over the surface of a base a non-etchable layer made of a material resistive to a prescribed etchant and defining a multiplicity of dot-like spaces of equal size and uniform placement, forming a multiplicity of etchable portions by filling the dot-like spaces with a material corrodible by the prescribed etchant, and smoothing the surfaces of the non-etchable layer and the etchable portions.

The above and other objects, features and advantages of this invention and the manner of attaining them will become more readily apparent, and the invention itself will best be understood, from the following description and appended claims taken in connecton with the accompanying drawings.

BRIEF DESCRIPTION OF THE DRAWINGS

In the drawings, which are all greatly enlarged views:

FIGS. 25 through 28, 29A, 30A and 31 are a series of fragmentary sectional views showing the sequential steps of manufacture of a gravure printing plate blank of the type shown in FIG. 20, with the completed blank being shown in FIG. 31;

FIGS. 29B and 30B are similar views showing an alternative to the steps of FIGS. 29A and 30A in the manufacture of the blank of FIG. 31;

DETAILED DESCRIPTION OF THE INVENTION

Figure 7:
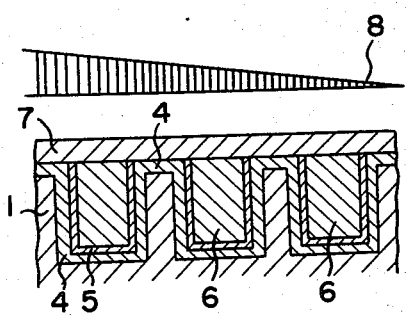
FIG. 7 is a similar view explanatory of how the completed blank of FIG. 6 is processed into a gravure printing plate.
Figure 8:
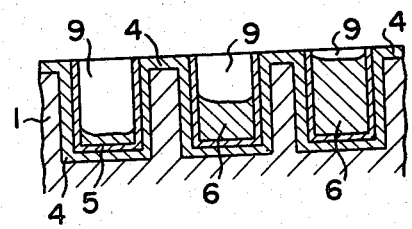
FIG. 8 is a similar view showing the completed gravure printing plate prepared from the blank of FIG. 6 through the step of FIG. 7.

FIGS. 1 through 6 of the above drawings illustrate a first preferred form of the gravure printing plate blank according to this invention, showing the sequential steps of its fabrication and the configuration of the completed blank. FIGS. 7 and 8, by the way, indicate a method of processing the completed blank into a desired gravure printing plate or cylinder. The following description will make clear both the manufacturing method and the configuration of the exemplified gravure printing plate blank.

Figure 1:
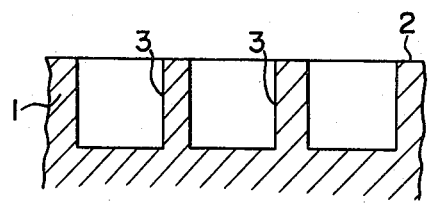
FIGS. 1 through 6 are a series of fragmentary sectional views showing the sequential steps of manufacture of a preferred form of the gravure printing plate blank according to this invention, with the completed blank being shown in FIG. 6.

FIG. 1 shows a base 1 which forms at least the surface layer of a gravure printing cylinder. This base is to be processed into the gravure printing plate blank of FIG. 6 in accordance with the invention and further into the gravure printing plate of FIG. 8. In this particular embodiment of the invention, the base 1 can be of any suitable material, but it is preferably made of copper.

The base 1 has a smooth surface 2 in which there are formed a multiplicity of minute depressions or pockets 3 of equal size and shape and of uniform placement. Preferably the arrangement of these pockets 3 corresponds to that of the dots in a gravure screen, although the pocket arrangement may also conform to the dot arrangement in a lithographic screen or a letterpress screen. The term "gravure screen" comprehends a usual photogravure screen with square dots, that with round dots, a contact screen, and other special-purpose varieties.

For the formation of the pockets 3, the surface 2 of the base 1 may be etched through a resist representing the pattern of a desired gravure screen. The etching process starts with the exposure of a carbon tissue through the gravure screen. The exposed carbon tissue is then placed over the smoothed surface 2 of the base 1 and is developed to provide an etching resist. Through this etching resist an appropriate etchant forms the desired pockets 3 in the base surface 2. Alternatively, the base surface 2 may first be coated with a photosensitive resin or photopolymer. The photopolymer coating is then exposed in place under the gravure screen and is developed to provide an etching resist. The pockets 3 can be formed by etching the base surface 2 through the thus-prepared resist as well.

An etching resist such as that of hardened gelatin, prepared by developing the exposed carbon tissue on the base as above, resists the permeation of the etchant only to a limited extent. That is to say, such an etching resist controls the permeation of the etchant to permit reproduction of continuous tones. If desired or required, therefore, this type of etching resist may be employed for reproduction, on the base surface 2, of a contact screen or the like with vignetted dots, in addition to that of gravure screens with sharply delineated dots of square or circular shape. The resist prepared from the photopolymer coating is suitable for use with the screens of the latter variety.

The carbon tissue represents but one of various photosensitive resists capable of reproducing continuous tones. Other photosensitive resists include such commercially available products as Autofilm (trademark of the product manufactured by Autotype Co., of Great Britain), Cronavure (trademark of the product manufactured by E. I. du Pont de Nemours & Co., of the United States), and Roto Film (trademark of the product manufactured by Du Pont).

Electronic or other engraving processes could likewise be adopted for the formation of the pockets 3 in the base surface 2. So formed, however, the pockets would assume a shape different from that pictured in FIG. 1, as will become apparent from the second embodiment of this invention to be presented subsequently.

Figure 2:
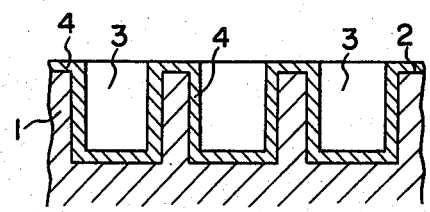

With reference to FIG. 2 the pocket-carrying surface 2 of the base 1 is then coated with a material that resists an etchant intended for use in processing the completed blank into a gravure printing plate. As shown at 4 in FIG. 2, the non-etchable layer overlies the complete surface 2 of the base 1 as well as its surface portions bounding the pockets 3.

Preferably, and if the etchant intended for use is a ferric chloride solution, as is usually the case, the non-etchable layer 4 is of chromium. The chromium layer may be formed by electroplating, to a thickness of about 15 microns. Chromium is also preferred from the standpoint of its excellent wear resistance, as parts of the non-etchable layer 4 will make direct contact with a doctor blade and printing surfaces at the time of printing.

Two or more non-etchable layers may be formed instead of only one layer 4 shown. All but at least the inmost of such multiple non-etchable layers may then be removed by a subsequent step of grinding, except for their portions covering the pocket-bounding surface portions of the base 1.

Figure 3:
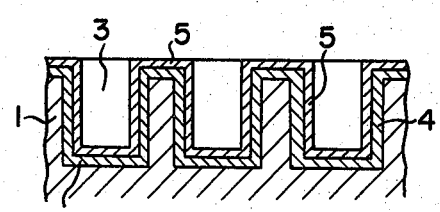

As shown in FIG. 3, as intermediate layer 5 is then formed over the non-etchable layer 4. This intermediate layer 5 is of a material having a high degree of adhesion to the non-etchable material forming the underlying layer 4 and to an etchable material to be filled into the pockets 3. Typically, formed by nickel electroplating, the intermediate layer 5 is of particular utility in the case where the etchable fillings (shown at 6 in FIGS. 5 and 6) will not adhere well to the non-etchable layer 4, for reasons that will manifest themselves as the description proceeds.

Nickel is employed as mentioned above to form the intermediate layer 5 because it adheres well both to chromium forming the non-etchable layer 4 and to copper to be used as the etchable fillings 6. The intermediate nickel layer may be electroplated to a thickness of about 0.1 micron, which is considerably less than the thickness of the non-etchable layer 4. This intermediate layer may also be of two or more sublayers.

Figure 4:
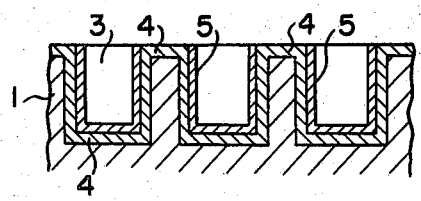

The article of FIG. 3 is then ground to an extent necessary for removal of only those portions of the intermediate layer 5 which overlie the base surface 2 excluding its pocket-bounding portions. FIG. 4 shows the resultant product. The intermediate layer 5 is now left only within the pockets 3, and those portions of the non-etchable layer 4 which overlie the base surface 2 excluding its pocket-bounding portions are exposed.

Figure 5:
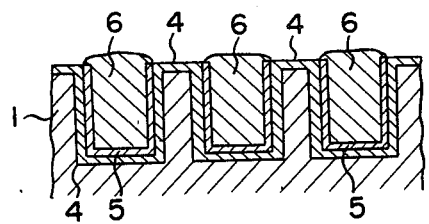

Next comes the noted step of filling an etchable material into the pockets 3 in the article of FIG. 4. This embodiment of the invention employs copper as the etchable material, as has been stated, on the assumption that the etchant intended for use in preparing a gravure printing plate from the completed blank is a ferric chloride solution. FIG. 5 shows the etchable fillings 6 of copper applied by electroplating. Copper adheres better to nickel forming the intermediate layer 5 within each pocket 3 than to chromium forming the non-etchable layer 4 over the base surface 2. Thus, in the electroplating operation, copper deposits mostly on and adheres to the intermediate layer 5 within each pocket. Copper deposition takes place on the non-etchable layer 4 to some limited extent, but the deposit does not adhere to this layer. The electrodeposited copper thus fills or rather, as shown in FIG. 5, overfills all the pockets 3 in the base surface 2.

The article of FIG. 5 is then again subjected to a grinding operation. This grinding operation is necessary for removal of the overflows of the etchable fillings 6 from the pockets 3. In the thus-ground article shown in FIG. 6, therefore, the etchable fillings 6 are flush with the exposed portions of the non-etchable layer 4 over the base surface 2.

Figure 6:
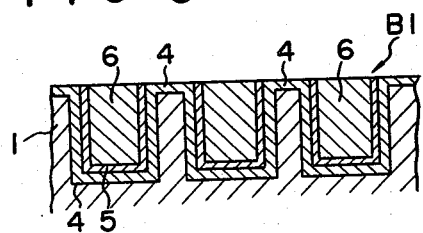

The article of FIG. 6 represents one preferred form of the gravure printing plate blank, labelled B1, according to this invention. The completed blank B1 has its surface formed by the exposed, interconnected portions of the non-etchable layer 4, in which there is formed an array or lattice of a multiplicity of minute etchable fillings 6 of equal size. The exposed portions of the non-etchable layer 4 and the etchable fillings 6 form a continuous, smooth surface.

In the process of fabricating the gravure printing plate blank B1 so far explained, the step of FIG. 4 may be omitted without departure from the scope of this invention. That is to say, the article of FIG. 3 may be subjected to the copper electroplating operation to form the etchable fillings 6 in its pockets 3, without previously grinding off the parts of the intermediate layer 5. According to this alternative procedure, the electrodeposited copper not only fills the pockets but also adheres to the intermediate layer portions covering the base surface other than its pocket-bounding portions. This article may then be ground to an extent necessary to obtain the desired gravure printing plate blank B1 of FIG. 6. If desired, however, the article may be ground to a less extent, leaving the intermediate layer portions flush with the etchable fillings 6.

What follows is a description of a possible procedure for processing the blank B1 of FIG. 6 into a gravure printing plate or cylinder having ink-retaining cells of varying depths, ready to print the desired image on paper or the like. A photosensitive resist such as a carbon tissue is first exposed through a prepared continuous-tone positive. Subsequently positioned over the blank B1 of FIG. 6, the exposed carbon tissue is developed and dried to provide an etching resist shown at 7 in FIG. 7. The blank B1 is then etched through the resist 7, by use of a ferric chloride solution in this particular embodiment, with the result that there are formed, in what have initially been the pockets 3, ink-retaining cells 9 (FIG. 8) of varying depths, and therefore of varying ink capacities, according to the tone values of the original.

Just how this happens may be explained by referring again to FIG. 7. Let it be supposed that the carbon tissue or resist 7 has been hardened to incrementally varying depths, as schematically depicted at 8, by the corresponding tone variation in the continuous-tone positive. The etchant permeates through this resist 7, and so eats away the etchable fillers 6, to correspondingly varying degrees. The darker the tone, the deeper are the ink-retaining cells 9 formed; the lighter the tone, the shallower the cells.

The gravure printing plate that has been completed as in FIG. 8 has its lands guarded by the highly wear-resistant, non-etchable chromium layer 4. The printing plate may therefore be put to direct use in actual printing operation, without any further processing.

It is understood that the carbon tissue used to form the etching resist in the preparation of the printing plate from the blank B1 is by way of example only. The continuous-tone etching resist may also be prepared by use of any such commercially available photosensitive resists as Autofilm, Cronavure, and Roto Film.

The gravure printing plate blank according to this invention is intended for repeated use. For the renewal of images to be printed, the used printing plate of FIG. 8 is immersed in an etchant bath such as a ferric chloride solution. The etchant bites into the remaining etchable fillings 6 but does not attack the non-etchable layer 4. Consequently, if the intermediate layer 5 is also of a non-etchable material, the used printing plate on immersion in the etchant bath will return to the state of FIG. 4. This article can be readily formed back into the blank B1 of FIG. 6 through the step of FIG. 5.

If the intermediate layer 5 in each pocket 3 is of an etchable material, then the printing plate on immersion in the etchant bath will return to the state of FIG. 2. This article may then be formed back into the blank B1 of FIG. 6 through the steps of FIGS. 3, 4 and 5.

This particular embodiment of the invention employs a ferric chloride solution as the etchant and copper as the etchable material. Thus, upon immersion of the used printing plate in the etchant bath as described above, ferric chloride and copper react to produce copper chloride, which melts nickel forming the intermediate layer 5. The printing plate therefore returns to the state of FIG. 2. This article may likewise be processed back into the blank B1 of FIG. 6 through the steps of FIGS. 3, 4 and 5.

The invention affords an alternative, simpler method of image renewal. After being washed clean and free from the printing ink, the used printing plate is directly plated with the etchable material to form the etchable fillings 6. Thus the printing plate returns directly to the state of FIG. 5, with a fresh supply of the etchable material overlying the remaining fillings.

Figure 9:
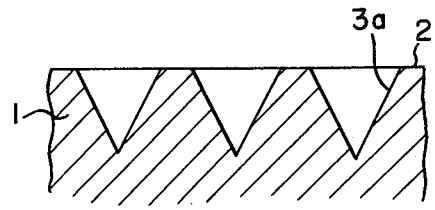
FIGS. 9 through 11 are a series of fragmentary sectional views showing the sequential steps of manufacture of another preferred form of the gravure printing plate blank according to the invention, with the completed blank being shown in FIG. 11.
Figure 13:
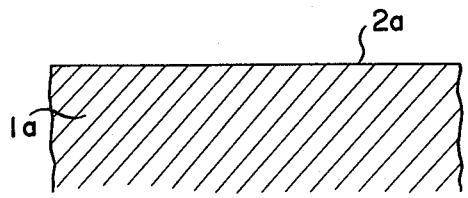
FIGS. 13 through 20 are a series of fragmentary sectional views showing the sequential steps of manufacture of still another preferred form of the gravure printing plate blank according to the invention, with the completed blank being shown in FIG. 20.

FIGS. 9 through 12 show another example of the process for the fabrication of a gravure printing plate blank, this blank being essentially of the same type as the blank B1 of FIG. 6. In FIG. 9 are shown a multiplicity of pockets 3a formed in the surface 2 of the base 1 constituting at least the surface layer of a gravure printing cylinder. Incised by electronic or like engraving operation, the pockets 3a are each typically in the shape of a cone, tapering downwardly to a pointed end.

Figure 10:
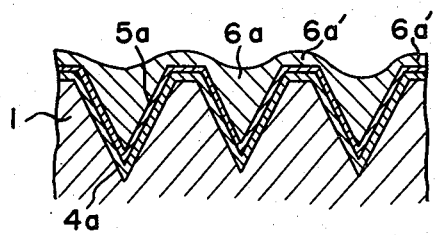

The article of FIG. 9 is processed as in the preceding example of the inventive method into the state of FIG. 10, which corresponds to that of FIG. 5 in the preceding example. According to this second example of the inventive process, however, etchable fillings 6a are plated without previous removal of parts of an intermediate layer 5a from the lands, so that the etchable fillings are all joined through connective portions 6a' overlying the lands.

Figure 11:
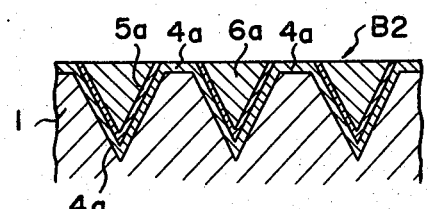

The article of FIG. 10 is then ground until the undesired connective portions 6a' of the etchable fillings 6a and the land-covering portions of the intermediate layer 5a are removed. FIG. 11 shows the resulting product, designated B2, which represents the second preferred form of the gravure printing plate blank according to the invention. As in the blank B1 of FIG. 6 the etchable fillings 6a are flush with the land-covering portions of a non-etchable, wear-resistant layer 4a.

Figure 12:
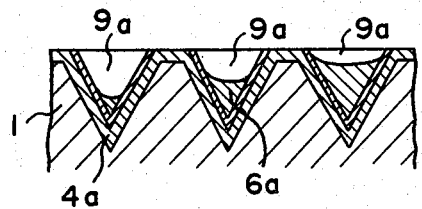
FIG. 12 is a similar view of a gravure printing plate prepared from the blank of FIG. 11.

For preparation of a desired gravure printing plate from the blank B2 an etching operation may be performed thereon through a suitably prepared etching resist as in FIG. 7. FIG. 12 gives the thus-formed gravure printing plate, showing its variable-depth ink-retaining cells at 9a.

Renewal of printing images may be effected by plating copper or like etchable material directly over the used printing plate after making the same free from the printing ink. Alternatively the used printing plate may first be immersed in an etchant bath for removal of the remaining etchable fillings, plated with the etchable material, and then ground to the state of FIG. 11. If the intermediate layer 5a is of a material that is molten in the etchant bath, a fresh intermediate layer may be plated over the non-etchable layer 4a after immersion of the used plate in the bath. Then the etchable material may be plated over the fresh intermediate layer.

FIGS. 13 through 20 show still another example of the process for the fabrication of a gravure printing plate blank according to the invention, the completed blank being of the type different from that of the blanks B1 and B2 of FIGS. 6 and 11. This third example of the inventive process differs from the two preceding examples in that there is employed a base 1a, forming at least the surface layer of a gravure printing cylinder, that has no pockets formed therein but has a smooth, blank surface 2a. This base 1a must be made of a material that can be corroded by the etchant to be used in the preparation of a gravure printing plate from the completed blank. If this etchant is a ferric chloride solution, therefore, the base 1a is preferably made of copper.

Figure 14:
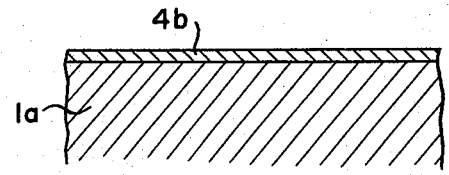
Figure 15:
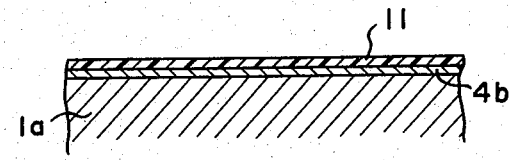

A non-etchable, wear-resistant material such as chromium is plated over the complete surface 2a of the base 1a, thereby forming a non-etchable layer 4b as shown in FIG. 14. This non-etchable layer may also be of multiple sublayers. Then, as shown in FIG. 15, a photopolymer is coated at 11 over the non-etchable layer 4b.

Figure 16:
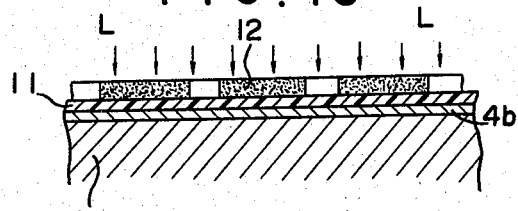

With reference to FIG. 16, the photopolymer coating 11 is exposed to light L under a gravure screen 12 and is then developed. The gravure screen 12 may be either positive (e.g., one with white lines and black dots) or negative, depending upon the type of the particular photopolymer in use. The photopolymer is required to harden on exposure to light if the gravure screen 12 is positive, and to soften on exposure to light if the gravure screen is negative. Either way, the gravure screen 12 should be of the type having lines and dots in sharp contrast.

FIG. 16 has been drawn on the assumption that the gravure screen 12 is positive and that the photopolymer coating 11 is of the type hardening on exposure to light. This photopolymer coating, therefore, hardens only in its regions exposed to light that has passed through the land-forming white lines of the gravure screen 12. The exposed photopolymer coating 11 is then washed, with the result that only its hardened regions remain as an etching resist 11' (FIG. 17) over the non-etchable layer 4b.

Figure 17:
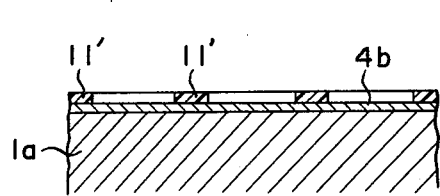

An etching operation is then performed on the article of FIG. 17. The etchant used in this operation must be one that corrodes the non-etchable layer 4b but which does not attack the base 1a. Since the base 1a is assumed to be of copper, and the non-etchable layer 4b to be of chromium, in this particular embodiment of the invention, the etchant is hydrochloric acid, among other substances. The etching operation provides the article of FIG. 18, in which the chromium layer 4b has been etched away except for its portions 4b' underlying the resist 11'.

An explanation will be made here to avoid confusion in the interpretation of some terminology used in this specification. The term "non-etchable material" as used herein means any substance that is not corroded by the etchant (e.g., a ferric chloride solution) used in processing the completed blank into the gravure printing plate. Chromium is called non-etchable because of its immunity to this particular etchant, even though it is susceptible to other etchants. Copper is called etchable because of its susceptibility to the instant etchant, even though it does resist hydrochloric acid employed as the etchant in the etchant operation described in conjunction with FIG. 18.

Figure 18:
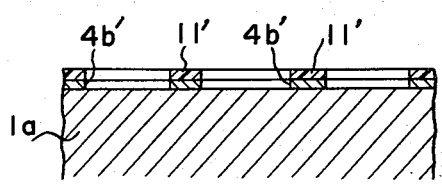
Figure 19:
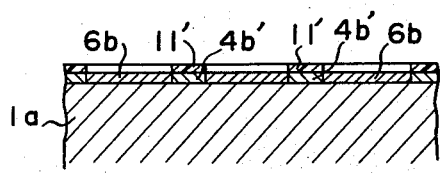

An etchable material such as copper is then plated over the exposed surface portions of the base 1a in the article of FIG. 18, to approximately the same thickness as the remaining non-etchable layer portions 4b'. FIG. 19 shows the resulting product, with the plated-on etchable portions designated 6b. The resist 11' is then removed from the article of FIG. 19, and the article is further ground to provide the gravure printing plate blank designated B3 in FIG. 20. In this blank B3, too, a multiplicity of minute dot-like etchable portions 6b are arranged uniformly and isolated from each other by the network of non-etchable layer portions 4b'.

Figure 21:
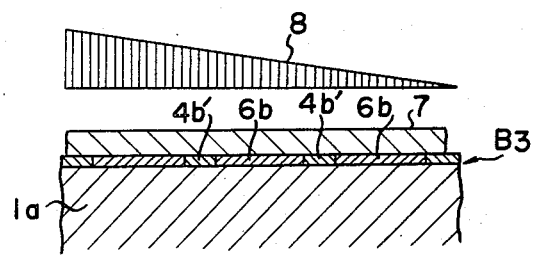
FIG. 21 is a similar view explanatory of how the blank of FIG. 20 is processed into a gravure printing plate.
Figure 22:
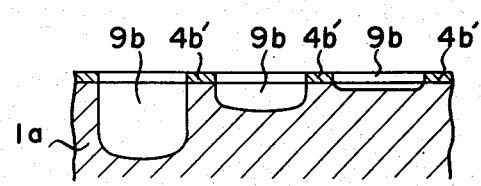
FIG. 22 is a similar view showing the completed gravure printing plate processed from the blank of FIG. 20 through the step of FIG. 21.
Figure 20:
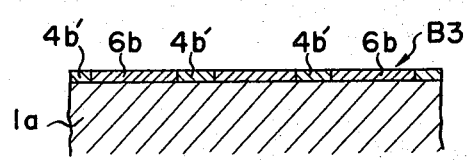

For preparation of a desired gravure printing plate from the blank B3 of FIG. 20, a carbon tissue is exposed through a continuous tone positive having tone variation such as that shown at 8 in FIG. 21. The exposed carbon tissue is then positioned over the blank B3 for use as the etching resist 7. By performing an etching operation on the article of FIG. 21, the etchant (e.g., a ferric chloride solution) eats away the etchable portions 6b and the underlying portions of the base 1a to varying depths depending upon the tone variation that has been imparted to the resist 7. FIG. 22 shows the thus-formed ink-retaining cells 9b in the completed gravure printing plate.

Figure 23:
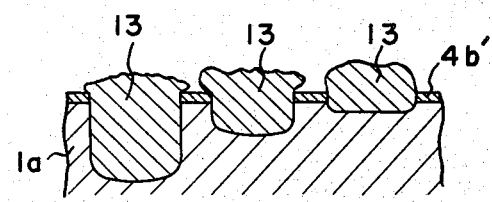
FIGS. 23 and 24 are a series of fragmentary sectional views showing the sequential steps of restoring the gravure printing plate of FIG. 22 to the blank state of FIG. 20.
Figure 24:
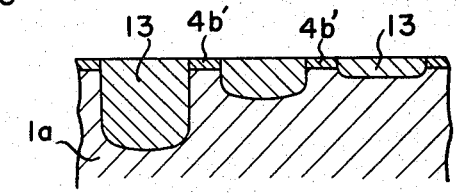

Printing images may be altered by plating an etchable material (e.g., copper) over the used printing plate after washing and removal of the printing ink. As shown at 13 in FIG. 23, the plated-on etchable material fills, or rather overfills, the cells 9b. The article of FIG. 23 is then ground as shown in FIG. 24. The ground article of FIG. 24 corresponds to the blank B3 of FIG. 20, with the plated-on etchable material integrally joined to the same material forming the base 1a.

FIGS. 25 through 31 indicate an alternative method of making a gravure printing plate blank substantially identical with the blank B3 of FIG. 20. As shown in FIG. 25, this alternative method also employs the smooth-surfaced base 1a of an etchable material such as copper. A photopolymer is coated over the blank surface 2a of the base 1a, as indicated at 14 in FIG. 26.

The photopolymer coating 14 is then exposed under the gravure screen 12 (FIG. 27) which may be either positive or negative. According to this alternative method the photopolymer in use is of the type softening on exposure to light if the gravure screen 12 is positive, and of the type hardening on exposure to light if the gravure screen is negative. FIG. 27 shows the gravure screen 12 to be positive, with white lines and black dots, so that the photopolymer in use is of the type softening on exposure to light.

Upon development of the exposed photopolymer coating 14 there is obtained over the base 1a a plating resist 14' (FIG. 28) which represents the array of dots in the gravure screen 12. Then, as shown in FIG. 29A, a non-etchable, wear-resistant material (e.g., chromium) is plated at 4c over the exposed surface portions of the base 1a which correspond to the network of lines in the gravure screen. This non-etchable layer may also be of two or more sublayers.

The removal of the plating resist 14' from the article of FIG. 29A provides an article as shown in FIG. 30A. An etchable material (e.g., copper) is then plated at 6c (FIG. 31) over the exposed surface portions of the base 1a. The plated article is then ground to provide a gravure printing plate blank B4 as shown in FIG. 31. This blank B4 also has the multiplicity of etchable portions 6c formed in and isolated from each other by the non-etchable layer portions 4c.

Alternatively the gravure printing plate blank B4 may be fabricated from the state of FIG. 28 through the steps of FIGS. 29B and 30B, instead of through the above described steps of FIGS. 29A and 30A. According to this alternative procedure the resist 14' must serve as an etching resist, since the article of FIG. 28 is exposed to an etchant which forms depressions 15 (FIG. 29B) in those surface portions of the base 1a which are left uncovered by the resist 14'. Then, as shown in FIG. 30B, the depressions 15 are filled at 4c' with the non-etchable material by a plating operation. The desired gravure printing plate blank can be obtained by subsequently grinding the article of FIG. 30B, thereby simultaneously removing the resist 14' and smoothing the surface of the article, or by first removing the resist 14' and then grinding the article to smooth its surface.

The blank B4 of FIG. 31 can be processed into a gravure printing plate through the same procedure as that represented in FIG. 21. Restoration of the used printing plate to the blank state of FIG. 31 is also possible through the same procedure as that indicated in FIGS. 23 and 24.

FIGS. 32 through 37 illustrate a further example of the process for the fabrication of a gravure printing plate blank according to the invention. The blank formed by this process may be advantageously processed into an intaglio halftone gravure printing plate, carrying ink-retaining cells of both varying depths and varying areas.

Figure 32:
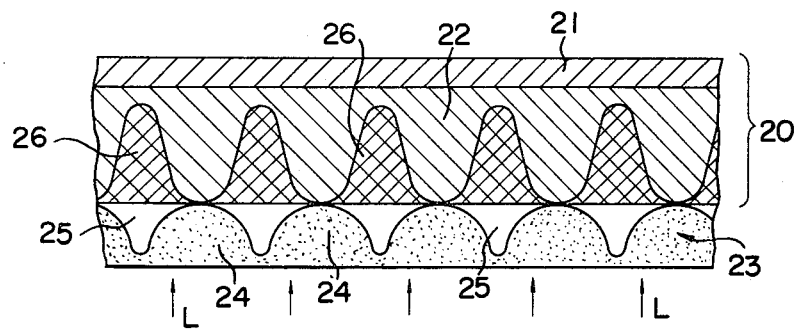
FIGS. 32 through 37 are a series of fragmentary sectional views showing the sequential steps of manufacture of a further preferred form of the gravure printing plate blank according to the invention, with the completed blank being shown in FIG. 37.

Shown at 20 in FIG. 32 is a carbon tissue which, as is well known, includes baryta paper 21 faced with a layer 22 of carbon tissue emulsion. This carbon tissue is placed in close contact with a special contact screen 23 is exposed to light L therethrough.

The contact screen 23 features a multiplicity of fine, generally black, vignetted dots 24 of equal size and shape and uniform placement. The density, or degree of opacity, of each dot 24 is the highest at its center, gradually lessening toward the periphery to shade off into white lines 25 crossing each other.

Figure 33:
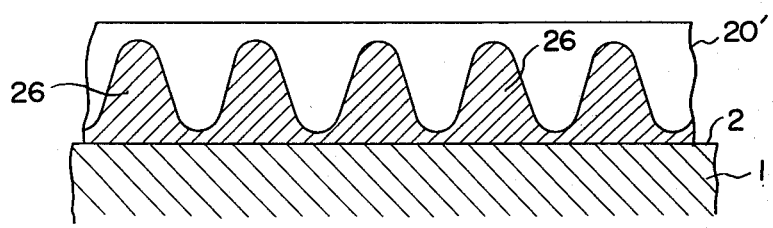
Figure 34:
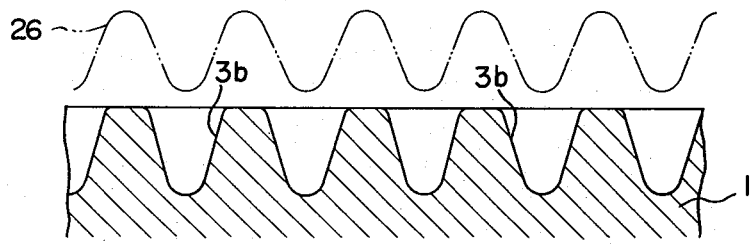
Figure 35:
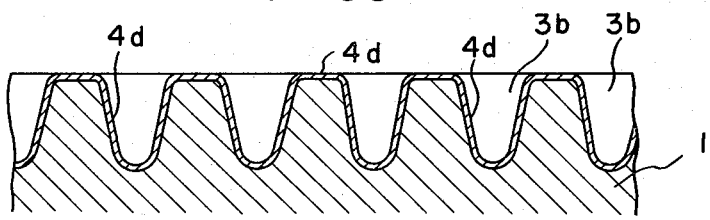

Upon exposure through this vignetted contact screen 23, the carbon tissue 20 hardens to varying depths, as shown at 26, according to the noted density distribution of the screen. The exposed carbon tissue 20 is then placed over the base 1 having the smooth surface 2, as shown in FIG. 33, and is developed for use in an etching resist 20'. A subsequent etching of the base 1 through the resist 20' produces in its surface 2 a multiplicity of pockets 3b (FIG. 34) in depth corresponding to the varying depth of the hardened regions 26 of the carbon tissue.

Figure 36:
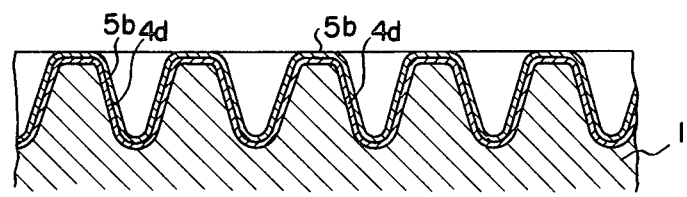

Chromium or like non-etchable, wear-resistant material is then plated at 4d (FIG. 35) over the entire surface 2 of the base 1 including its pocket bounding surface portions. Then, as shown in FIG. 36, an intermediate layer 5b is formed over the non-etchable layer 4d, as by nickel electroplating. The article of FIG. 36 is then ground for removal of the land-covering portions of the intermediate layer 5b, thereby exposing the land-covering portions of the non-etchable layer 4d.

Copper or like etchable material is then electroplated over the ground article to form etchable fillings 6d (FIG. 37) within the pockets 3b. A subsequent grinding of this article provides the desired gravure printing plate blank generally designated B5 in FIG. 37. Alternatively the etchable material may be plated immediately over the article of FIG. 36, instead of after grinding the same. The thus-plated article may then be ground to an extent necessary for removal of the land-covering portions of the intermediate layer 5b.

Figure 37:
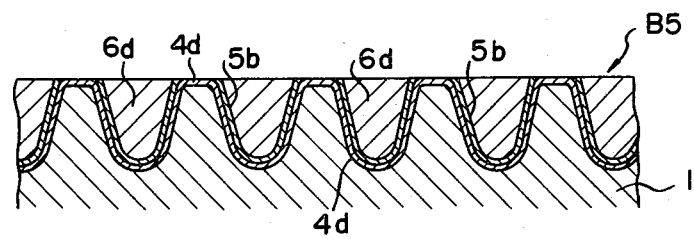
Figure 38:
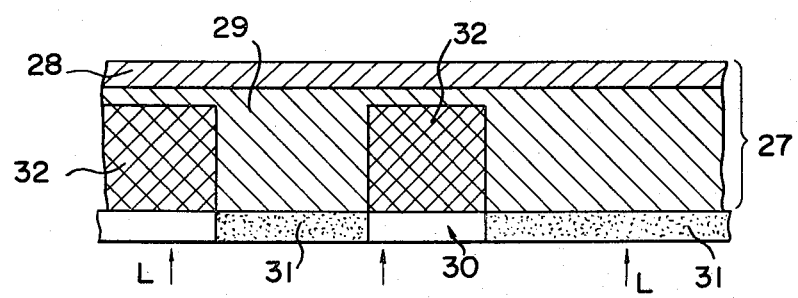
FIGS. 38 through 41 are a series of fragmentary sectional views showing the sequential steps of processing the blank of FIG. 37 into an intaglio halftone gravure printing plate having ink-retaining cells of variable depth and variable area, with the completed printing plate being shown in FIG. 41.

FIGS. 38 through 41 sequentially illustrate one of the possible procedures for preparation of an intaglio halftone gravure printing plate from the blank B5 of FIG. 37. FIG. 38 shows a carbon tissue 27 having baryta paper 28 faced with a layer 29 of the carbon tissue emulsion. This carbon tissue is exposed to light L through, and in close contact with, a prepared planographic or letterpress halftone positive 30 having dots as at 31. The result is the selective hardening, as at 32, of the carbon tissue emulsion layer 29.

Figure 39:
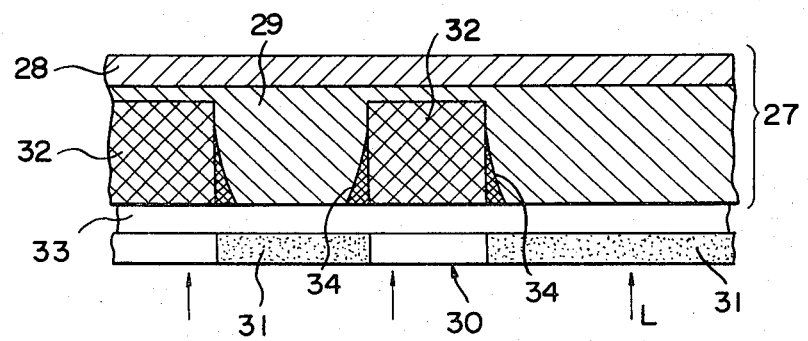

The exposed carbon tissue is then subjected to the second exposure, as shown in FIG. 39, this time with a light diffusion sheet 33 interposed between and held in close contact with the carbon tissue and the same halftone positive 30 as before. The diffusion sheet 33 may be in the form of either matte-surfaced plastic film, opal glass, or ultrafine ground glass. The diffusion sheet 33 diffuses the light L that has passed through the halftone positive 30, resulting in the flaring, as at 34, of the previously hardened regions 32 of the carbon tissue 27.

Figure 40:
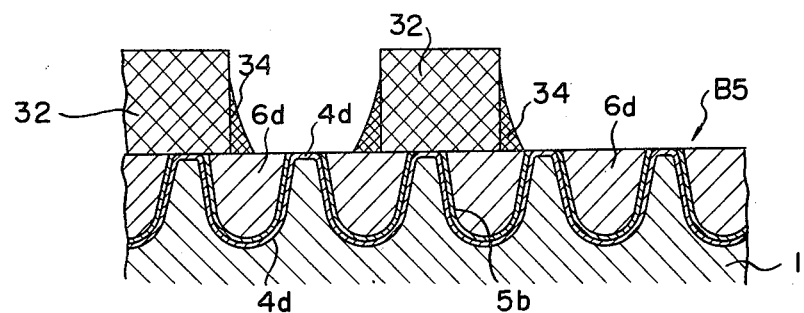
Figure 41:
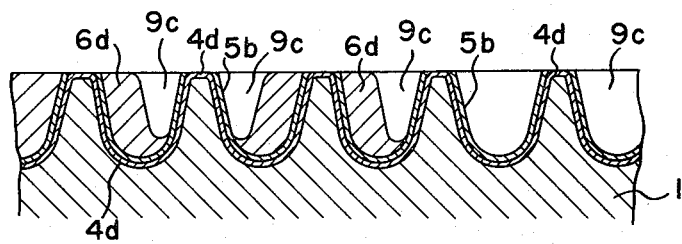

The doubly exposed carbon tissue 27 is then placed over the blank B5 of FIG. 37. The developing of this carbon tissue leaves only its successively hardened regions 32 and 34 over the blank B5 as an etching resist, as shown in FIG. 40. The article of FIG. 40 is then subjected to an etchant, such as a ferric chloride solution, that attacks only the etchable fillings 6d of the blank B5. Upon subsequent removal of the resist there is completed the desired intaglio halftone gravure printing plate as shown in FIG. 41.

In the completed intaglio halftone gravure printing plate the etchable fillings 6d have been etched, either in part or in full, to form ink-retaining cells 9c of varying depths and varying areas depending upon the tonal values of the original. The chromium-plated lands of the printing plate isolate the cells 9c from each other, serving to prevent the over-lapping of the printed dots in the shadows. The chromium-plated lands further function to extend the printing life of the plate. Autofilm, Cronavure, Roto Film and other commercially available continuous tone photosensitive resists may be employed in lieu of the noted carbon tissue.

For restoration of the used intaglio halftone gravure printing plate back to the blank state of FIG. 37, the etchable material may be plated over the plate after washing the same clean and free of the printing ink. A simple grinding of this plated article restores the same to the blank B5 of FIG. 37. New printing images can be delineated on the thus-regained blank B5 through the procedure of FIGS. 38 through 41.

In marked contrast to the prior art, the present invention makes it unnecessary to imprint a vignetted contact screen on the carbon tissue or the like in preparing the printing plate from the blank B5. This is because the blank itself performs the function of the vignetted contact screen.

The process of FIGS. 32 through 37 features the use of the vignetted contact screen 23 for the preparation of the etching resist 20' from the carbon tissue 20. Formed by etching through this resist 20', the pockets 3b in the base 1 have their boundaries appreciably more rounded than those produced by use of the usual gravure screen. The ink-retaining cells 9c formed by removal, either partial or complete, of the etchable fillings 6d in these pockets 3b are capable of depositing proper amounts of ink on a desired surface, producing dots that are rather rounded than angled.

Figure 42:
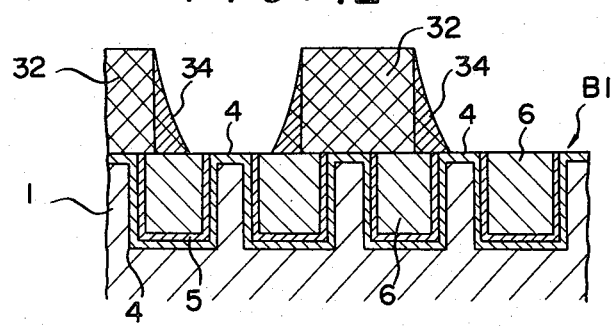
FIG. 42 is a fragmentary sectional view explanatory of how the blank of FIG. 6 is processed into an intaglio halftone gravure printing plate having ink-retaining cells of variable depth and variable area.
Figure 43:
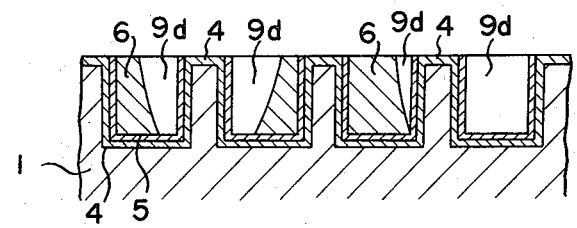
FIG. 43 is a similar view of the completed intaglio halftone gravure printing plate prepared from the blank of FIG. 6 through the step of FIG. 42.

The platemaking procedure of FIGS. 38 through 41 is applicable to any of the other gravure printing plate blanks B1 through B4 disclosed herein. FIGS. 42 and 43 show, by way of example, the above procedure as applied to the blank B1 of FIG. 6. The state of FIG. 42 corresponds to that of FIG. 40, with the doubly exposed carbon tissue 27 placed over the blank B1 and developed to leave only its hardened regions 32 and 34 as an etching resist.

An etching operation is then performed on the article of FIG. 42, as with use of a ferric chloride solution. The resist is then removed to complete the intaglio halftone gravure printing plate of FIG. 43, which has ink-retaining cells 9d of varying depths and varying areas formed by partial or complete removal of the etchable fillings 6 in the pockets. Restoration of this printing plate back to the blank state of FIG. 6 is also possible through the same procedure as described above.

It will be obvious to those skilled in the art that various modifications of this invention may be resorted to within the intended scope of this invention.

What is claimed is:

1. A process for the fabrication of a gravure printing plate blank comprising the steps of providing a base having a surface, forming a multiplicity of minute pockets of equal size and uniform placement in the surface of the base, forming a non-etchable layer over the surface of the base including its portions bounding the pockets, the non-etchable layer being of a material resistive to a prescribed etchant, forming an intermediate layer within each pocket, forming thereafter a multiplicity of dot-like etchable portions by filling the pockets with a material corrodible by the prescribed etchant whereby the intermediate layer lies between the non-etchable layer and the etchable portion in each pocket, said intermediate layer being made of a material having a high degree of adhesion both to the material of the non-etchable layer and to the material of the etchable portions, and smoothing the exposed surface portions to the non-etchable layer and the surfaces of etchable portions.

2. The process of claim 1, further comprising the steps of forming an intermediate layer directly over the non-etchable layer, the intermediate layer being of a material having a high degree of adhesion both to the material of the non-etchable layer and to the material of the etchable portions, and removing the exposed portions of the intermediate layer.

3. The process of claim 2, wherein the exposed portions of the intermediate layer are removed by a grinding operation, and wherein the exposed portions of the non-etchable layer and the surfaces of the etchable portions are simultaneously smoothed by the grinding operation.

4. A process for the fabrication of a gravure printing plate blank comprising the steps of providing a base having a surface, the base being of a material corrodible by a prescribed etchant, forming a layer of a photopolymer over the surface of the base, exposing the photopolymer layer through a gravure screen having a network of lines defining a multiplicity of dots of equal size and uniform placement, developing the exposed photopolymer layer to form a resist corresponding to the dots in the gravure screen, forming a non-etchable layer over those surface portions of the base which are left uncovered by the resist, the non-etchable layer being of a material resistive to the prescribed etchant, removing the resist to expose those surface portions of the base which correspond to the dots in the gravure screen, forming an etchable layer over each exposed portion of the base which is formed by thus removing said resist, the etchable layer being of a material corrodible by the prescribed etchant, and smoothing the surface of the non-etchable layer and the etchable layer on the base.

5. A process for the preparation of an intaglio halftone gravure printing plate comprising the steps of preparing a gravure printing plate blank having a non-etchable layer overlying at least the surface of a base and made of a material resistive to a prescribed etchant, the gravure printing plate blank also having a multiplicity of dot-like etchable portions of equal size and uniform placement formed at least in and isolated from each other by the non-etchable layer, the etchable portions being of a material corrodible by the prescribed etchant, exposing a photosensitive resist through and in close contact with a prepared halftone positive, further exposing the resist through a light diffusion sheet and the same halftone positive, with the light diffusion sheet interposed between and held in close contact with the resist and the halftone positive, placing the resist over the gravure printing plate blank, developing the resist, and etching the gravure printing plate blank through the resist with the prescribed etchant, thereby forming ink-retaining cells in the etchable portions of the gravure printing plate blank.

6. A process for the preparation of an intaglio halftone gravure printing plate comprising the steps of exposing a photosensitive resist through a contact screen having a multiplicity of generally black, vignetted dots of equal size and uniform placement, placing the exposed resist over the surface of a base, developing the exposed resist, etching the surface of the base through the developed resist, thereby forming in the surface of the base a multiplicity of pockets corresponding to the vignetted dots in the contact screen, forming a non-etchable layer over the surface of the base including its portions bounding the pockets, the non-etchable layer being of a material resistive to a prescribed etchant, forming a multiplicity of etchable portions by filling the pockets with a material corrodible by the prescribed etchant, smoothing the exposed surface portions of the non-etchable layer and the surfaces of the etchable portions, thereby completing a halftone gravure printing plate blank, exposing a second photosensitive resist through and in close contact with a prepared halftone positive, further exposing the second resist through a light diffusion sheet and the same halftone positive, with the light diffusion sheet interposed between and held in close contact with the second resist and the halftone positive, placing the second resist over the halftone gravure printing plate blank, developing the second resist, and etching the halftone gravure printing plate blank through the second resist with the prescribed etchant, thereby forming ink-retaining cells in the etchable portions of the halftone gravure printing plate blank.

7. The process of claim 5 or 6, wherein the halftone positive is the one for planographic printing.

* * * * *